(12) United States Patent
Roohparvar et al.

(10) Patent No.: US 7,746,691 B2
(45) Date of Patent: Jun. 29, 2010

(54) METHODS AND APPARATUS UTILIZING PREDICTED COUPLING EFFECT IN THE PROGRAMMING OF NON-VOLATILE MEMORY

(75) Inventors: Frankie F. Roohparvar, Monte Sereno, CA (US); Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 193 days.

(21) Appl. No.: 12/136,546

(22) Filed: Jun. 10, 2008

(65) Prior Publication Data

US 2009/0303788 A1 Dec. 10, 2009

(51) Int. Cl.
*G11C 16/04* (2006.01)
(52) U.S. Cl. .............................. 365/185.02; 365/185.24; 365/185.28
(58) Field of Classification Search ............ 365/185.02, 365/185.24, 185.28
See application file for complete search history.

(56) References Cited

U.S. PATENT DOCUMENTS

| | | | | |
|---|---|---|---|---|
| 5,867,429 A | * | 2/1999 | Chen et al. | 365/185.33 |
| 7,535,761 B2 | * | 5/2009 | Park et al. | 365/185.12 |
| 2006/0002190 A1 | | 1/2006 | Roohparvar | |
| 2006/0187712 A1 | * | 8/2006 | Roohparvar | 365/185.19 |
| 2007/0189073 A1 | | 8/2007 | Aritome | |

* cited by examiner

*Primary Examiner*—Hoai V Ho
(74) *Attorney, Agent, or Firm*—Leffert Jay & Polglaze, P.A.

(57) ABSTRACT

Methods and memory devices configured to utilize predicted coupling effects of neighboring memory cells in the programming of target memory cells can be utilized to tighten the distribution of threshold voltages for a given bit pattern by compensating for anticipated threshold voltage shift due to capacitive coupling, which can facilitate more discernable Vt ranges, and thus a higher number of bits of data per memory cell. Tightening the distribution of threshold voltages can further facilitate wider margins between Vt ranges, and thus an increased reliability in reading the correct data value of a memory cell.

25 Claims, 7 Drawing Sheets

METHODS AND APPARATUS UTILIZING PREDICTED COUPLING EFFECT IN THE PROGRAMMING OF NON-VOLATILE MEMORY

TECHNICAL FIELD

The present disclosure relates generally to semiconductor memory, and in particular, in one or more embodiments, the present disclosure relates to methods and apparatus utilizing predicted coupling effects in the programming of non-volatile memory.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but often include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes (e.g., floating gates or trapping layers) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
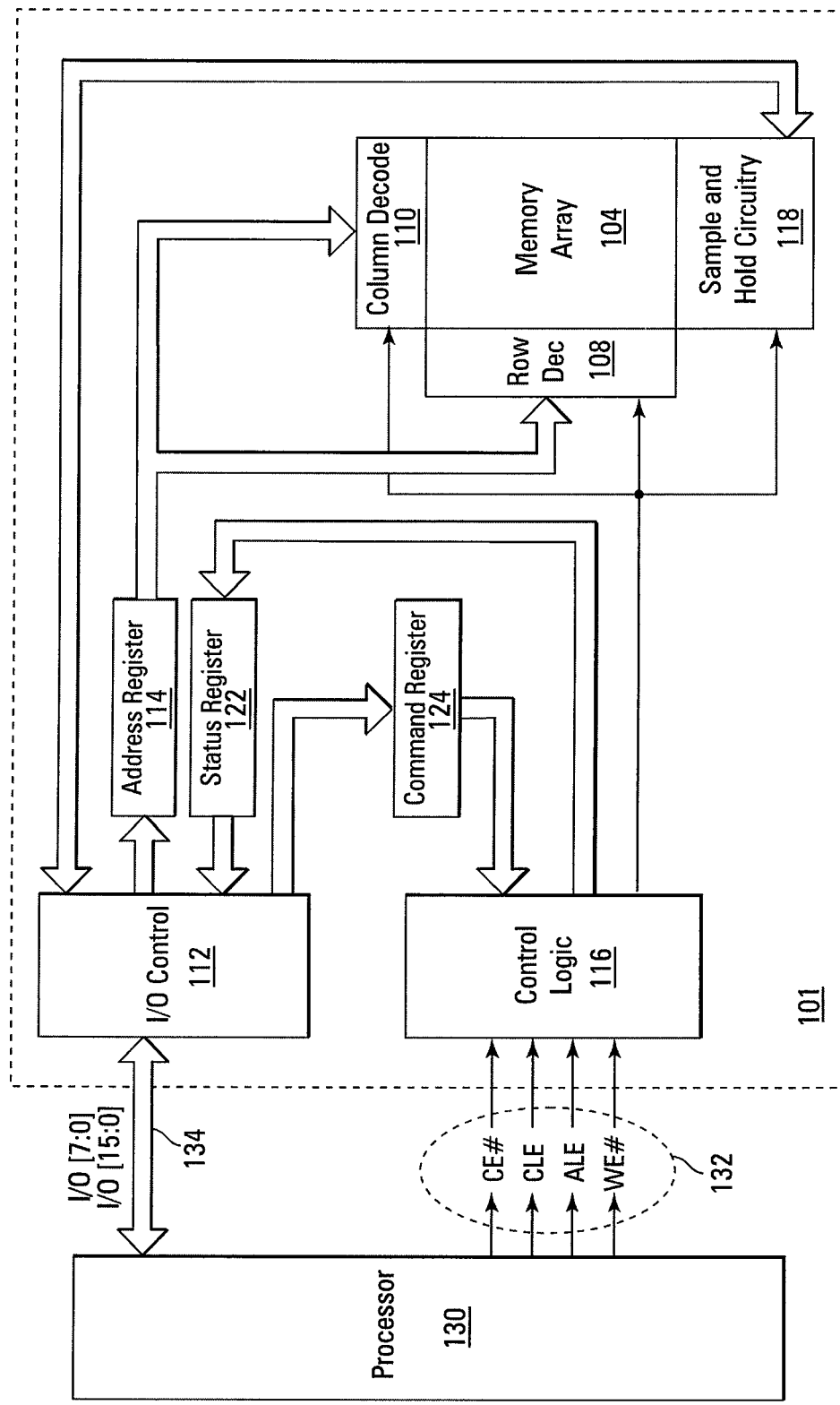
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of digital signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values, often in the form of bit patterns. Typically, a dead space (which is often referred to as margin) of 0.2V to 0.4V is between each range to keep the Vt ranges from overlapping. If the Vt of the cell is within the first range, the cell may be deemed to store a logical 11 state and is typically considered the erased state of the cell. If the Vt is within the second range, the cell may be deemed to store a logical 10 state. If the Vt is within the third range, the cell may be deemed to store a logical 00 state. And if the Vt is within the fourth range, the cell may be deemed to store a logical 01 state.

When programming a traditional MLC device as described above, cells are generally first erased, as a block, to correspond to the erased state. Following erasure of a block of cells, the cell is first programmed in accordance with the least-significant bit (LSB), if necessary. For example, if the LSB is a 1, then no programming is necessary, but if the LSB is a 0, then the Vt of the target memory cell is moved from the Vt range corresponding to the 11 logic state to the Vt range corresponding to the 10 logic state. The cell is then programmed in accordance with the most-significant bit (MSB) in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value, e.g., bit pattern, of the cell. The memory devices of various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although various embodiments will be described primarily with reference to NAND memory arrays, the invention is not limited to a specific architecture of a memory array 104. Some examples of other array architectures include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog signals. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital signal representative of an intensity of the illumination. In the present embodiments, a charge may be stored on a capacitor in response to subjecting it to an analog signal having a voltage level indicative of an actual or target threshold voltage of a memory cell for reading or programming, respectively, the memory cell. This charge could then be converted to an analog signal using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital signal (e.g., representing a bit pattern) and to convert write data from a digital signal to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digital signals representative of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
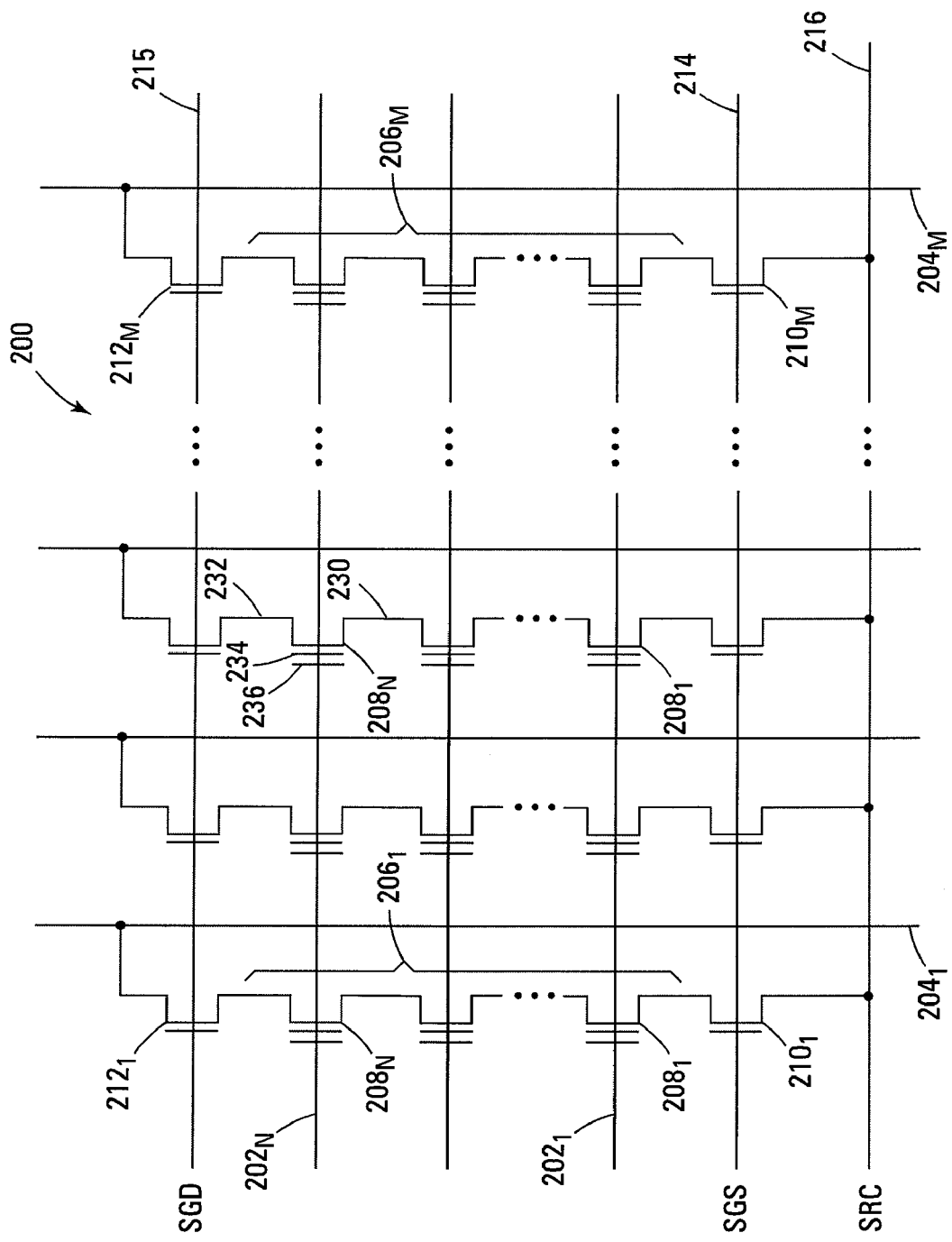
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines (which may comprise commonly coupled control gates $202_1$ to $202_N$) and intersecting data lines, such as bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202 (e.g., the control gates may be commonly coupled to form a word line). A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
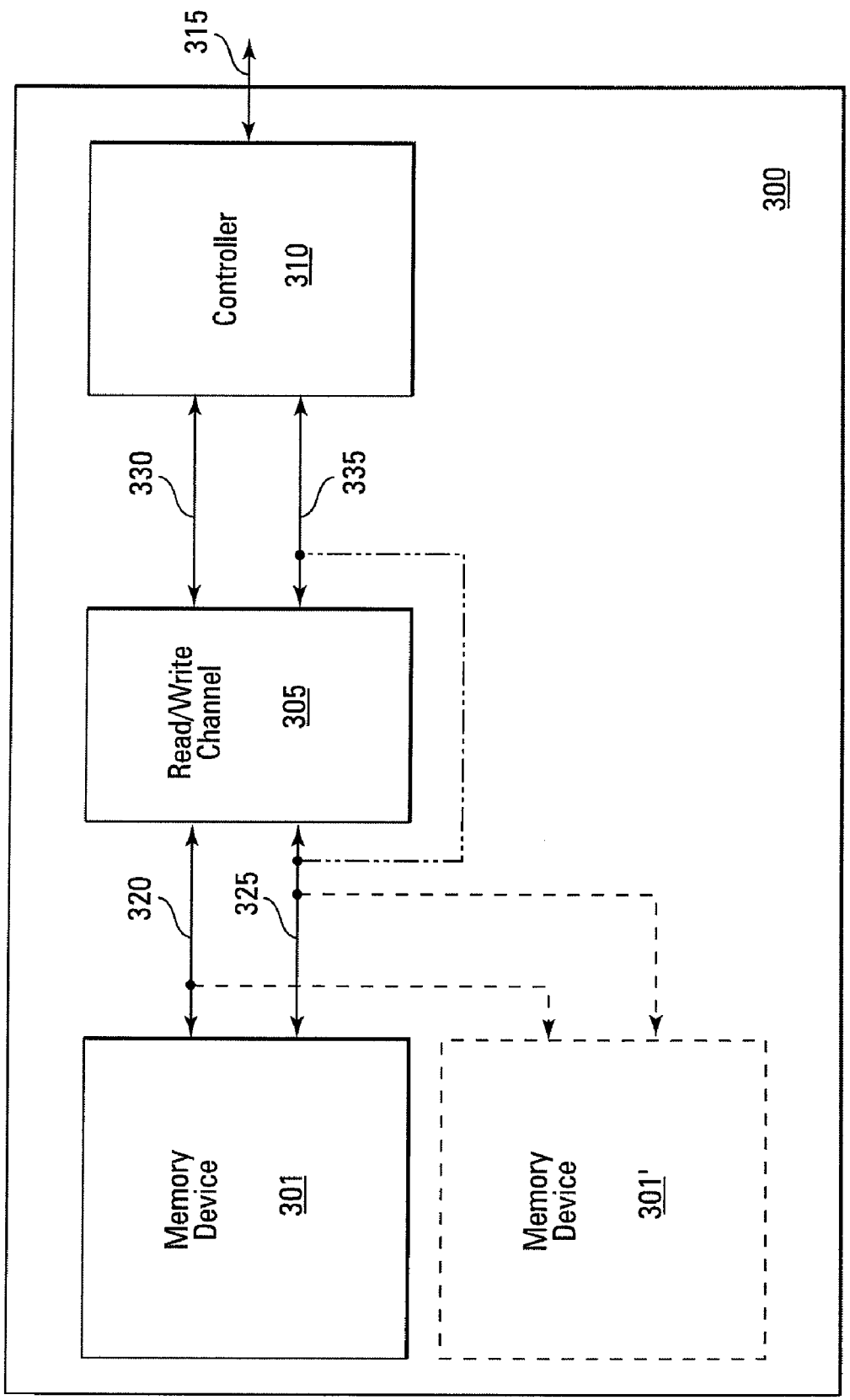
FIG. 3 is a block schematic of a solid state bulk storage device in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital signal to an analog signal and vice versa. Digital data signals may have a discrete number of voltage levels, e.g., a first voltage level indicative of a digit having a first binary data value, e.g., 0, and a second voltage level indicative of a digit having a second binary data value, e.g., 1. An analog data signal may have different voltage ranges corresponding to different bit patterns of two or more bits. For example, in a system adapted to store two bits per memory cell, a first voltage level within a range of voltage levels of an analog data signal could correspond to a bit pattern of 11, a second voltage level within a second range of voltage levels of an analog data signal could correspond to a bit pattern of 10, a third voltage level within a third range of voltage levels of an analog data signal could correspond to a bit pattern of 00 and a fourth voltage level within a fourth range of voltage levels of an analog data signal could correspond to a bit pattern of 01. Thus, one analog data signal in accordance with the various embodiments could be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 could use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

In this situation, the read/write channel 305 may employ signal processing similar to that used in HDD accessing called PRML (i.e., partial response, maximum likelihood). In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
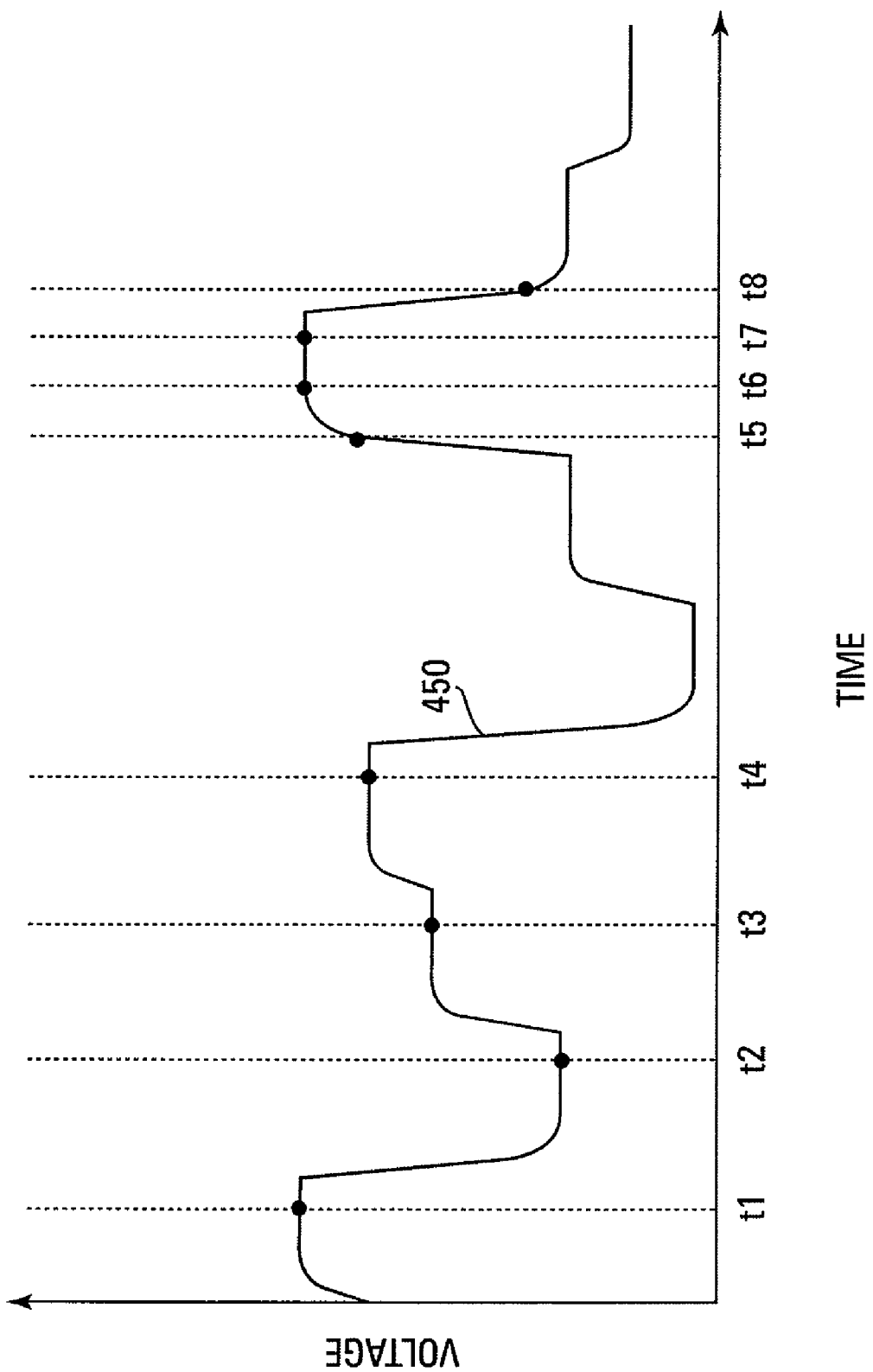
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) data in a second set of locations. During a read operation, both the user data and the ECC data are read in response to a read request of the user data. Using known algorithms, the user data returned from the read operation is compared to the ECC data. If the errors are within the limits of the ECC, the errors will be corrected.

Figure 5:
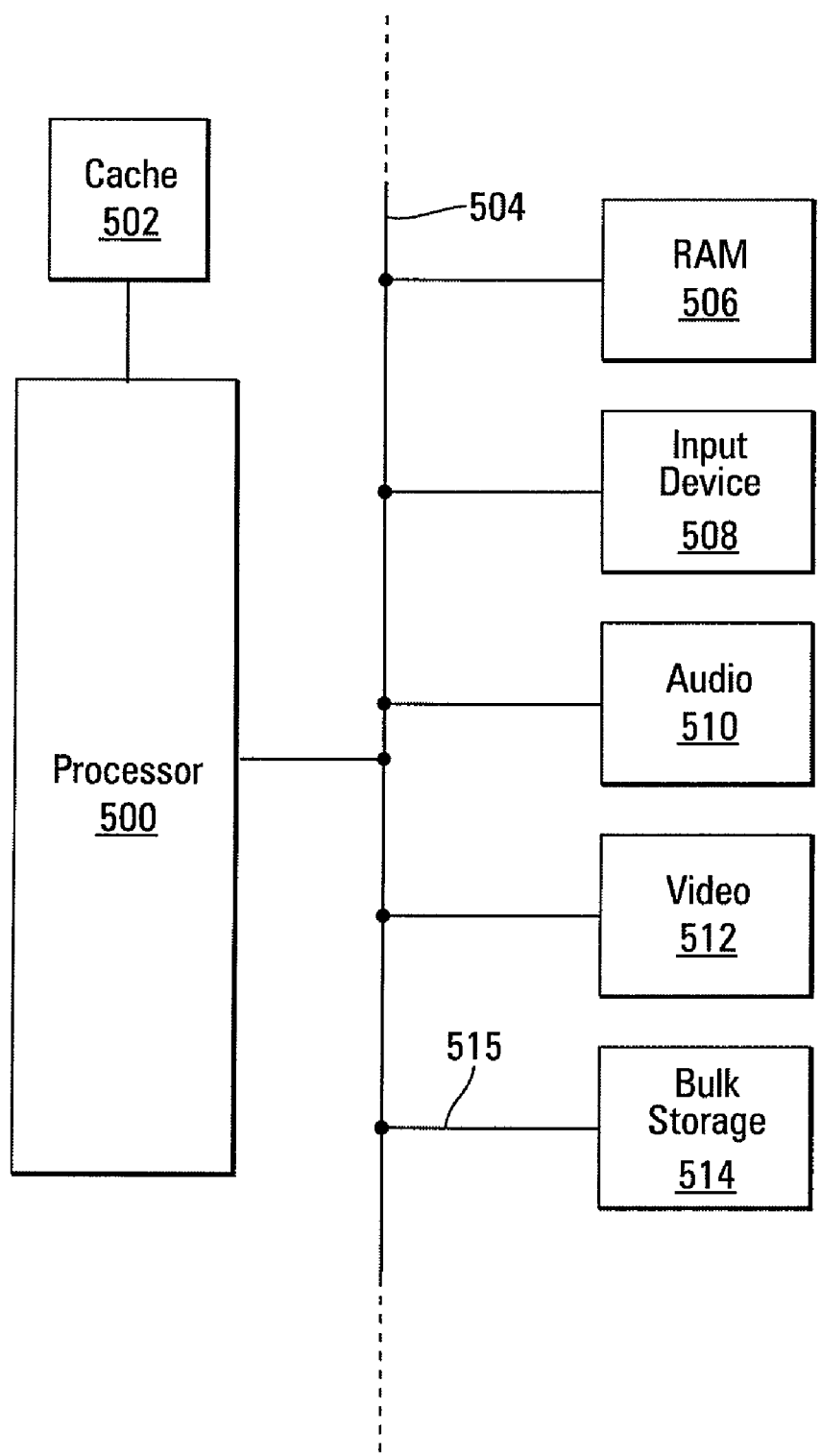
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals, and a signal processor adapted to perform digital-to-analog conversion of digital data signals received from the bus interface 515 and analog-to-digital conversion of analog data signals received from its memory device(s).

Capacitive coupling between floating gates of adjacent memory cells generally will affect their threshold voltages. Thus, subsequently-programmed memory cells will generally tend to pull up the threshold voltage of a prior-programmed neighboring memory cell. For example, non-volatile memory cells are typically erased, or brought to some initial threshold voltage, prior to programming to their desired threshold voltage. This initial threshold voltage is usually a negative voltage, e.g., −1V. Memory cells are then programmed in sequence to their desired threshold voltages. Programming generally involves applying a series of programming pulses of increasing voltage to increase the charge stored on the floating gate, with each pulse generally followed by a verify operation to determine whether the memory cell has reached its desired threshold voltage. This usually occurs for a logical page of a word line, such as even or odd columns of that word line. As individual memory cells reach their desired threshold voltage, they are inhibited from further programming. Upon reaching the desired threshold voltages for all memory cells along a given page of a word line, memory cells along that page of an adjacent word line are then programmed. This process is repeated until memory cells along each word line of a column of memory cells are programmed.

As memory cells along a subsequent word line are programmed, their increasing threshold voltages will alter the capacitive coupling effect between memory cells along the prior word line as well as memory cells in adjacent columns. This will result in an increase of the threshold voltage of these prior-programmed memory cells. While this threshold voltage increase is small, it can hinder the ability to store increasing numbers of bits of data per memory cell. As memory cells are used to store more and more bits of data per cell, the Vt ranges associated with each bit pattern become more narrow and the margins between the Vt ranges also generally decrease, thus making the coupling effect more troublesome as there is less room for such Vt drift. Thus, by predicting the coupling effect of subsequently-programmed memory cells, the coupling effect can be advantageously utilized to tighten the distribution of threshold voltages for a given bit pattern by compensating for anticipated threshold voltage shift due to capacitive coupling, which can facilitate more discernable Vt ranges, and thus a higher number of bits of data per memory cell, and/or wider margins between Vt ranges, and thus increased reliability in reading the correct data value of a memory cell.

As noted above, as threshold voltages of subsequently-programmed memory cells rise, their coupling effect on prior-programmed neighboring memory cells increases. For example, an increase of 1V in the threshold voltage of a subsequently-programmed memory cell may result in an increase in the threshold voltage of a prior-programmed adjacent memory cell in the same column by 20-50 mV, depending upon device geometry and materials of fabrication. Thus, the expected change in threshold voltage of the target memory cell can be calculated by multiplying the expected increase of threshold voltages of subsequently-programmed neighboring memory cells by some expected coupling coefficient, e.g., 2-5%, and adding the products of each neighboring memory cell considered. The coupling coefficient defines the expected change in threshold voltage of a target memory cell in response to a unit change in the threshold voltage of a subsequently-programmed neighboring memory cell. Coupling coefficients can be determined by characterization of the memory device. Consider the simple example of two neighboring memory cells that are to be subsequently programmed, with a first memory cell being adjacent the target memory cell in the same column and a second memory cell being adjacent the target memory cell in an adjacent column. The first memory cell may be expected to have a stronger influence on the coupling effect to the target memory cell than the second memory cell, so the coupling coefficient of the first memory cell may be 4% while the coupling coefficient of the second memory cell may be 3%, although actual coupling coefficients will be dependent upon device geometry and materials. If the first memory cell is expected to have an increase of 2.8V in its threshold voltage during subsequent programming and the second memory cell is expected to have an increase of 1.7V in its threshold voltage during subsequent programming, the coupling effect on the target memory cell might be calculated as 2.8V*0.04+1.7V*0.03 or 163 mV. The expected changes in threshold voltages can be determined empirically by programming memory cells and observing the changes in effective threshold voltages of neighboring memory cells. The observed responses could then be averaged or otherwise statistically analyzed to develop expected changes based on the various data values of neighboring cells.

Alternatively, the expected changes could be determined theoretically based on device geometry and materials of fabrication. However, such a rigorous determination of expected changes in effective threshold voltage would not be necessary to obtain benefits of predicting coupling effects as described herein.

Figure 6:
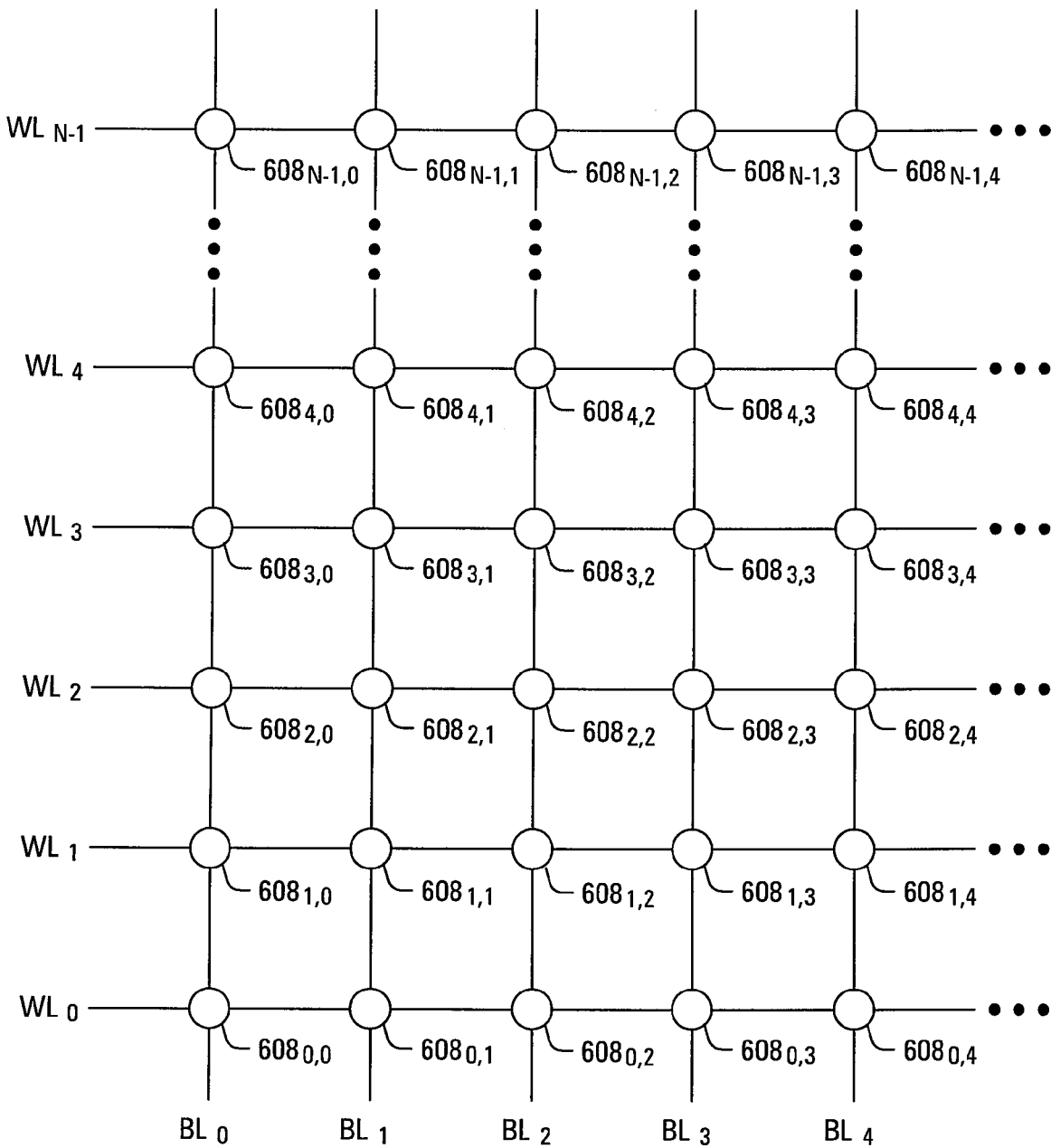
FIG. 6 is a schematic of one embodiment of a portion of a NAND memory array to aid understanding of the programming method of FIG. 7.
Figure 7:
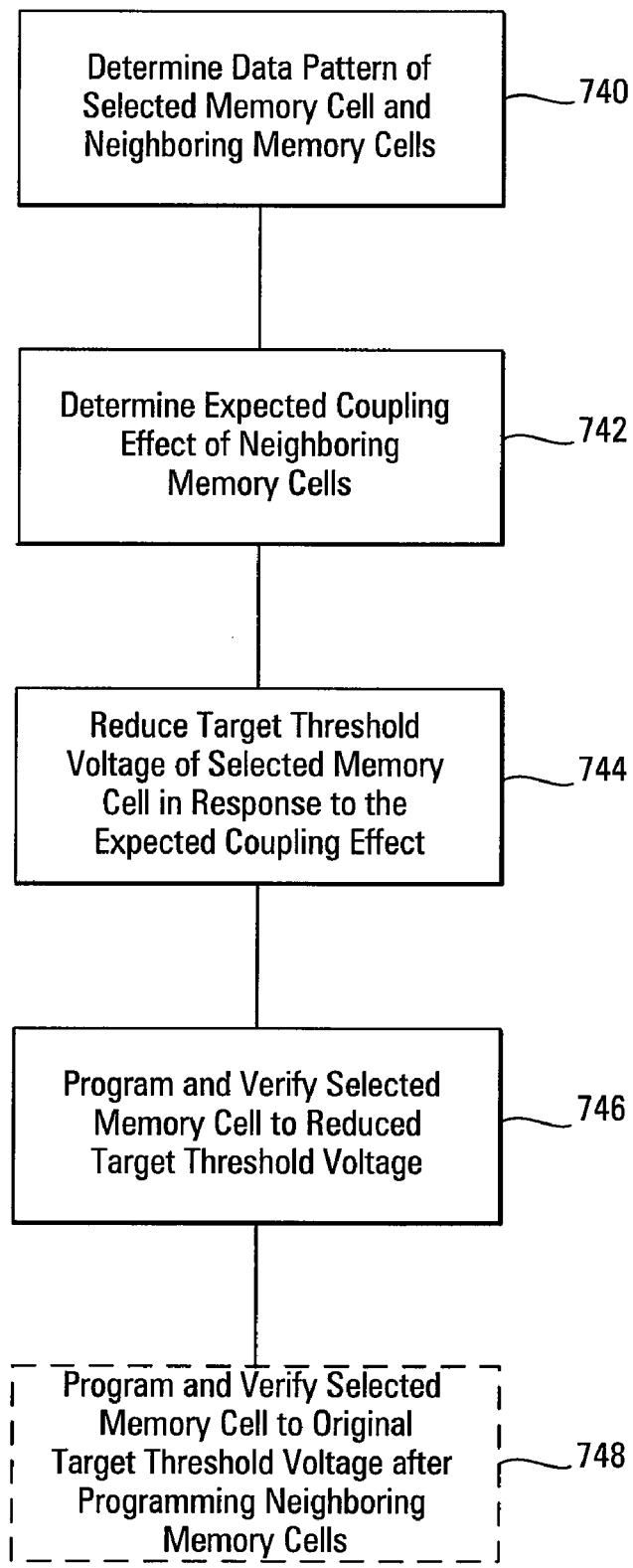
FIG. 7 is a flowchart of a programming method in accordance with an embodiment of the disclosure.

FIG. 6 is a schematic of one embodiment of a portion of a NAND memory array to aid understanding of the programming method of FIG. 7. The various embodiments will be discussed with reference to subsequently-programmed neighboring memory cells. A neighboring memory cell is a memory cell being close enough to the target memory cell to be expected to be able to exert a capacitive coupling effect on the target memory cell. Neighboring memory cells may include those memory cells immediately adjacent to the target memory cell. However, other memory cells may also exert an influence, albeit to a lesser degree. Thus, for some embodiments, neighboring memory cells may further include memory cells that are within two or more memory cells of the target memory cell. For example, with reference to FIG. 6, if the target memory cell is memory cell $608_{2,2}$, immediately adjacent memory cells include $608_{1,1}$, $608_{1,2}$, $608_{1,3}$, $608_{2,1}$, $608_{2,3}$, $608_{3,1}$, $608_{3,2}$ and $608_{3,3}$, while memory cells within two memory cells of the target memory cell would, in addition, include $608_{0,0}$, $608_{0,1}$, $608_{0,2}$, $608_{0,3}$, $608_{0,4}$, $608_{1,0}$, $608_{1,4}$, $608_{2,0}$, $608_{2,4}$, $608_{3,0}$, $608_{3,4}$, $608_{4,0}$, $608_{4,1}$, $608_{4,2}$, $608_{4,3}$ and $608_{4,4}$. Including further degrees of neighboring memory cells would facilitate improved compensation for coupling effect, but it is an improvement of diminishing returns with increasing calculation complexity. The majority of the compensation can be obtained by looking only to those memory cells immediately adjacent the target memory cell.

Other groupings of memory cells may also be evaluated when determining expected coupling effect. For example, if the target memory cell is memory cell $608_{2,2}$, the relevant neighboring memory cells might include those memory cells within a diamond shape bounded by memory cells $608_{1,2}$, $608_{2,1}$, $608_{3,2}$ and $608_{2,3}$, or those memory cells within a diamond shape bounded by memory cells $608_{0,2}$, $608_{2,0}$, $608_{4,2}$, and $608_{2,4}$. The groupings need not be symmetrical. For example, testing can be performed on the memory device to determine which memory cells have the most significant impact on capacitive coupling, and the selection of memory cells for evaluation could be limited to those memory cells exceeding some threshold effect, regardless of their location relative the target memory cell. Similarly, the groupings of memory cells need not be the same throughout the memory array. As is well know, processing variations result in different portions of a memory array having different performance characteristics. Thus, the groupings of neighboring memory cells may vary based upon the location of the target memory cell within the memory array.

Not all neighboring memory cells need be evaluated when predicting coupling effects. Where one or more of the neighboring memory cells are programmed prior to the target memory cell, their coupling effect will already be taken into account when programming the target memory cell. In other words, if a neighboring memory cell has already been programmed before the target memory cell, the programming and verification of the target memory cell will occur under the influence of the coupling effect of the prior-programmed memory cell such that no further change in threshold voltage of the target memory cell would be expected after programming. For example, if the target memory cell is memory cell $608_{2,2}$, and programming of the string of memory cells proceeds from the bottom (WL0) up, then memory cells $608_{0,2}$ and $608_{1,2}$ would not need to be considered in the prediction of coupling effect. This would be true also for neighboring memory cells on adjacent bit lines. For example, if the memory cells of bit lines BL1 and BL3 are programmed prior to the memory cells of bit line BL2, these memory cells would not need to be considered in the prediction of coupling effect for the subsequent programming of the target memory cell $608_{2,2}$. In general, the prediction of coupling effect is only relevant to those neighboring memory cells changing their threshold voltage after programming of the target memory cell. However, for a rigorous evaluation, prior-programmed memory cells could be taken into account. For example, a prior-programmed neighboring memory cell may have its threshold voltage pulled up after programming of the target memory cell if its neighboring memory cells have a subsequent coupling effect on the prior-programmed neighboring memory cell, thus causing a ripple effect. But, this ripple effect resulting from prior-programmed neighboring memory cells need not be considered as it will generally be a lesser effect than the effect of subsequently-programmed neighboring memory cells.

FIG. 7 is a flowchart of a programming method in accordance with an embodiment of the disclosure. The method determines the data pattern of a target memory cell and neighboring memory cells at 740. The neighboring memory cells may be restricted to those memory cells immediately adjacent the target memory cell. For another embodiment, neighboring memory cells include those memory cells that are within two memory cells of the target memory cell. Other groupings of neighboring memory cells may also be used. For one embodiment, the neighboring memory cells includes only neighboring memory cells that may be subsequently programmed. The data pattern defines what desired threshold voltages would be assigned to each of the memory cells to store that data pattern.

Upon determining the data pattern of those memory cells relevant to predicted coupling effect, e.g., the neighboring memory cells to be programmed subsequent to the target memory cell, the method determines the expected coupling effect of those memory cells at 742. By determining the data pattern to be programmed into the neighboring memory cells, the expected change in their own threshold voltages is known. As each of these neighboring cells is programmed to its desired threshold voltage subsequent to programming the target memory cell, they will tend to pull up the threshold voltage of the target memory cell. Based on the expected change in threshold voltage of the neighboring cells, their expected coupling effect on the target memory cell can be calculated as discussed above. For simplicity, the effects of individual neighboring memory cells can be summed in determining the combined effect on the target memory cell. However, as each neighboring memory cell is subsequently programmed, and the threshold voltage of the target memory cell increases, the actual effect of individual memory cells would begin to decrease as the differential in threshold voltage between the target memory cell and the memory cell presently being programmed would decrease. Thus, for another embodiment, the expected coupling effect of neighboring memory cells may be determined individually in the order of programming. As an enhancement, the neighboring memory cells may be read to determine their initial threshold voltage. It is known that although the memory cells may all be erased prior to programming, their threshold voltages will fall within a distribution. Thus, by reading the neighboring memory cells prior to determining their expected coupling effect, a more accurate determination of the expected rise in their own threshold voltages may be made. In addition, the neighboring memory cells may be pre-programmed to some threshold voltage less than their target threshold voltage prior to performing the read operation. Because the coupling effect is proportional to the change in threshold voltage of a subsequently-programmed memory cell, the expected coupling effect may be reduced by increasing the threshold voltages of neighboring cells prior to making the determination, as this will reduce the shift in their threshold voltages needed to reach their target threshold voltages during subsequent programming.

The expected coupling effect may be determined in a single iteration, or multiple iterations could be used to more accurately predict the coupling effect. For example, the expected coupling effect could be calculated by summing the products of the expected rise in threshold voltage of each relevant neighboring memory cell and its coupling coefficient. For another example, the expected coupling effect could be calculated by using the desired threshold voltage of the target memory cell and the desired threshold voltages of the subsequently-programmed neighboring memory cells. Upon calculating the expected rise in the threshold voltage of the target memory cell based on the data pattern of the neighboring memory cells, this expected rise in threshold voltage could be taken to be the expected coupling effect.

In a further embodiment, the expected coupling effect on a target memory cell may be calculated by reading the threshold voltages of the neighboring memory cells and determining a difference between their read threshold voltages and their desired threshold voltages upon programming. These differences in threshold voltages of the neighboring cells are then multiplied by their respective coupling coefficients relative to the target memory cell. The expected coupling effect on the target memory cell is then calculated by the summation of the individual coupling effects of the neighboring cells which are to be programmed after the target memory cell is programmed. By determining a target threshold voltage of the target memory cell as its desired threshold voltage minus the expected coupling effect, the target memory cell would be expected to be close to its desired threshold voltage after programming the neighboring memory cells.

Alternatively, the calculation could be based on the data pattern of the neighboring memory cells, but start with an initial threshold voltage of the target memory cell that is less than the desired threshold voltage. As the desire is to allow the coupling effect to pull the effective threshold voltage up to the desired threshold voltage, this alternate calculation may be more true as it would better simulate the actual operation, i.e., programming the target memory cell to a threshold voltage less than desired, and allowing the threshold voltage to rise in response to the subsequent programming of neighboring memory cells. The initial threshold voltage of the target memory cell for such a calculation can be a particular value, such as 0.1V less than the desired threshold voltage, or it can be calculated, such as some value proportional to the average differential of threshold voltages between the target memory cell and the subsequently-programmed neighboring memory cells.

As a further enhancement, the calculation could proceed through multiple iterations. For example, starting with either the desired threshold voltage of the target memory cell, or some other initial threshold voltage offset from the desired value, the expected coupling effect could be determined. If the expected rise of the threshold voltage of the target memory cell results in an expected threshold voltage of the target memory cell that is greater than the desired threshold voltage, the initial threshold voltage could be reduced and the calculation could proceed through another iteration. For example, if the expected threshold voltage is 0V above the desired threshold voltage, the initial threshold voltage for the next iteration could be 0.1V lower than the previous initial threshold voltage. Alternatively, the next initial threshold voltage could be determined by subtracting some fraction, e.g., 95%, of the difference between the desired threshold voltage and the prior initial threshold voltage. If the expected rise of the threshold voltage of the target memory cell results in an expected threshold voltage of the target memory cell that is less than the desired threshold voltage, the initial threshold voltage could be increased and the calculation could proceed through another iteration. The increase could be equal to the difference between the desired threshold voltage and the prior initial threshold voltage. Alternatively, the increase could be some multiple, e.g., 105%, of the difference. This process could repeat until the expected threshold voltage is within a defined ΔV, e.g., +/−0.1V, of the desired threshold voltage or some maximum number of iterations have been performed, the values of which may be selected by the designer or user of the device. The difference between the initial threshold voltage of the target memory cell and the expected threshold voltage (e.g., the desired threshold voltage) for the last iteration of the calculation can be taken as the expected coupling effect, i.e., the expected rise in the threshold voltage of the target memory cell after programming of the neighboring memory cells.

It is noted that various methods of determining an expected coupling effect may be combined. For example, determining the expected coupling effect could involve calculating an expected coupling effect using coupling coefficients and adjusting that calculated value based upon the location of the target memory cell within the array.

At 744, the method reduces the target threshold voltage of the target memory cell at least partially in response to the expected coupling effect of subsequently-programmed neighboring memory cells. It is noted that other factors could further be considered, such as ambient conditions during programming, device age, historical information, etc. For one embodiment, the target threshold voltage can be determined by subtracting the expected coupling effect from the desired threshold voltage. For another embodiment, where the expected coupling effect is determined iteratively, the target threshold voltage can be taken as the initial threshold voltage for the last iteration of the calculation. After reducing the target threshold voltage of the target memory cell, the method programs and verifies the target memory cell to the target threshold voltage at 746. After subsequently programming the neighboring memory cells that were evaluated in determining the target threshold voltage, the memory cell may be programmed and verified to the desired threshold voltage at 748 to ensure that it has attained its desired threshold voltage.

The various embodiments include memory devices configured to utilize predicted coupling effects of neighboring memory cells to reduce a target threshold voltage for a memory cell selected for programming. The coupling effect can be advantageously utilized to tighten the distribution of threshold voltages for a given bit pattern by reducing unanticipated Vt drift, which can facilitate more discernable Vt ranges, and thus a higher number of bits of data per memory cell, and/or wider margins between Vt ranges, and thus an increased reliability in reading the correct data value of a memory cell.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of programming a target memory cell in an array of non-volatile memory cells, comprising:
  determining a data pattern of the target memory cell and one or more neighboring memory cells, wherein the data pattern defines a desired threshold voltage for each of the target memory cell and the one or more neighboring memory cells;
  determining an expected coupling effect of the one or more neighboring memory cells on the target memory cell; and
  programming the target memory cell to a target threshold voltage that has been reduced from the desired threshold voltage at least partially in response to the expected coupling effect.

2. The method of claim 1, wherein determining the expected coupling effect of the one or more neighboring memory cells comprises determining the expected coupling effect of one or more neighboring memory cells to be programmed subsequent to the target memory cell.

3. The method of claim 2, further comprising:
  programming the target memory cell to the desired threshold voltage after programming the one or more subsequently-programmed neighboring memory cells.

4. The method of claim 1, wherein determining the expected coupling effect of the one or more neighboring memory cells comprises determining individual expected coupling effects of each of the one or more neighboring memory cells and summing them.

5. The method of claim 4, wherein determining individual expected coupling effects of each of the one or more neighboring memory cells comprises determining individual expected coupling effects of each of the one or more neighboring memory cells in an order of programming.

6. The method of claim 1, wherein determining the expected coupling effect of the one or more neighboring memory cells comprises a determining the expected coupling effect of the one or more neighboring memory cells at least partially based on device geometry and materials of fabrication or on expected coupling coefficients of the one or more neighboring memory cells.

7. The method of claim 1, wherein determining the expected coupling effect of the one or more neighboring memory cells comprises determining the expected coupling effect of the one or more neighboring memory cells in an iterative process.

8. The method of claim 7, wherein the iterative process comprises:
  determining an expected threshold voltage of the target memory cell after programming the one or more neighboring memory cells if the target memory cell were to be programmed to the target threshold voltage prior to programming the one or more neighboring memory cells;
  adjusting the target threshold voltage down if the expected threshold voltage is greater than the desired threshold voltage and adjusting the target threshold voltage up if the expected threshold voltage is less than the desired threshold voltage; and
  performing another iteration using the adjusted target threshold voltage.

9. The method of claim 8, further comprising:
  wherein adjusting the target threshold voltage down if the expected threshold voltage is greater than the desired threshold voltage comprises adjusting the target threshold voltage down by a fraction of a difference between the target threshold voltage and the desired threshold voltage; and wherein adjusting the target threshold voltage up if the expected threshold voltage is less than the desired threshold voltage comprises adjusting the target threshold voltage up by a fraction of the difference between the target threshold voltage and the original desired threshold voltage.

10. The method of claim 1, wherein programming the target memory cell to a target threshold voltage that has been reduced from the desired threshold voltage comprises determining the target threshold voltage by subtracting an expected rise in threshold voltage from the desired threshold voltage.

11. The method of claim 1, wherein programming the target memory cell to the target threshold voltage comprises:
storing an analog data signal or an equivalent bit pattern at the memory device indicative of the target threshold voltage;
applying programming pulses to the target memory cell to increase a threshold voltage of the target memory cell;
determining whether the threshold voltage of the target memory cell has reached the target threshold voltage; and
re-applying programming pulses to the target memory cell if its threshold voltage is less than the target threshold voltage.

12. A solid state memory device, comprising:
an array of non-volatile memory cells;
circuitry for control and/or access of the array of non-volatile memory cells;
wherein the circuitry for control and/or access is configured to generate an analog data signal or an equivalent bit pattern indicative of a threshold voltage of a target memory cell of the array; and
wherein the circuitry for control and/or access is configured to perform a method of programming the target memory cell comprising determining an expected coupling effect on the target memory cell by the one or more neighboring memory cells and reducing the desired threshold voltage of the target memory cell to a target threshold voltage at least partially in response to the expected coupling effect before programming.

13. The memory device of claim 12, wherein determining the expected coupling effect of the one or more neighboring memory cells in the method of programming the target memory cell comprises programming memory cells of the array and observing changes in threshold voltages of neighboring memory cells, and statistically analyzing the observed responses to develop expected changes based on various data values of neighboring memory cells.

14. The memory device of claim 12, wherein determining the expected coupling effect of the one or more neighboring memory cells in the method of programming the target memory cell comprises determining the expected coupling effect of the one or more neighboring memory cells individually and summing the coupling effects of each of the one or more neighboring memory cells in a single iteration.

15. The memory device of claim 12, wherein determining the expected coupling effect of the one or more neighboring memory cells in the method of programming the target memory cell comprises reading threshold voltages of the one or more neighboring memory cells, determining a difference between a desired threshold voltage and the read threshold voltage for each of the one or more neighboring memory cells, multiplying the difference of each of the one or more neighboring memory cells with a corresponding coupling coefficient, and summing the products of the difference and the coupling coefficient corresponding to each of the one or more neighboring memory cells.

16. The memory device of claim 12, wherein determining the expected coupling effect of the one or more neighboring memory cells upon the target memory cell in the method of programming the target memory cell comprises determining the expected coupling effect of the one or more neighboring memory cells upon the target memory cell starting at a target threshold voltage that is less than the desired threshold voltage in an iterative process modifying the target threshold voltage until an expected threshold voltage of the target memory cell is within a particular absolute difference with the desired threshold voltage.

17. The memory device of claim 12, wherein determining the expected coupling effect of the one or more neighboring memory cells in the method of programming the target memory cell comprises determining the expected coupling effect of only those one or more neighboring memory cells that are to be programmed subsequent to the target memory cell.

18. The memory device of claim 17, wherein the method of programming the target memory cell further comprises:
programming the target memory cell to the desired threshold voltage after programming the one or more subsequently-programmed neighboring memory cells.

19. A method of programming a target memory cell in an array of non-volatile memory cells, comprising:
determining a data pattern of the target memory cell and one or more neighboring memory cells to be programmed after the target memory cell, wherein the data pattern defines a respective desired threshold voltage for each of the target memory cell and the one or more neighboring memory cells;
determining an expected coupling effect of the one or more neighboring memory cells on the target memory cell;
programming the target memory cell to a threshold voltage less than the desired threshold voltage and calculated at least partially in response to the expected coupling effect of the one or more neighboring memory cells;
programming the one or more neighboring memory cells; and
programming the target memory cell to the desired threshold voltage.

20. The method of claim 19, wherein programming the one or more neighboring memory cells comprises programming at least one of the neighboring memory cells to a threshold voltage less than its desired threshold voltage at least partially in response to an expected coupling effect of one or more of its neighboring memory cells to be programmed subsequent to that memory cell.

21. The method of claim 19, wherein determining the expected coupling effect of the one or more neighboring memory cells comprises determining individual expected coupling effects of one or more immediately adjacent neighboring memory cells or determining the expected coupling effect of one or more neighboring memory cells located within two memory cells of the target memory cell.

22. The method of claim 19, wherein determining the expected coupling effect of the one or more neighboring memory cells comprises determining the expected coupling effect of one or more neighboring memory cells that have been determined to exceed some particular effect on the threshold voltage of the target memory cell.

23. The method of claim 19, wherein determining the expected coupling effect of the one or more neighboring memory cells comprises determining the expected coupling effect of one or more neighboring memory cells selected based at least partially in response to a location of the target memory cell within the array of non-volatile memory cells.

24. The method of claim 19, wherein determining the expected coupling effect of the one or more neighboring memory cells comprises performing a read operation on the one or more neighboring memory cells to determine an initial threshold voltage for each of the one or more neighboring memory cells, and determining an expected rise in threshold voltage for each of the one or more neighboring memory cells from their respective initial threshold voltages and their respective desired threshold voltages.

25. The method of claim 24, further comprising pre-programming the one or more neighboring memory cells to threshold voltages less than their respective desired threshold voltages prior to performing the read operation.

* * * * *